(12) United States Patent
Kong et al.

(10) Patent No.: US 8,996,148 B2
(45) Date of Patent: Mar. 31, 2015

(54) CONTROLLING GAIN DURING MULTIPATH MULTI-RATE AUDIO PROCESSING

(75) Inventors: Hongwei Kong, Denville, NJ (US); Nelson Sollenberger, Farmingdale, NJ (US); Li Fung Chang, Holmdel, NJ (US)

(73) Assignee: Broadcom Corporation, Irvine, CA (US)

( * ) Notice: Subject to any disclaimer, the term of this patent is extended or adjusted under 35 U.S.C. 154(b) by 465 days.

(21) Appl. No.: 13/111,660

(22) Filed: May 19, 2011

(65) Prior Publication Data
US 2011/0222711 A1    Sep. 15, 2011

Related U.S. Application Data

(63) Continuation of application No. 11/565,358, filed on Nov. 30, 2006, now Pat. No. 7,949,419.

(51) Int. Cl.
*G06F 17/00* (2006.01)
*H03G 3/30* (2006.01)
*H03G 3/00* (2006.01)

(52) U.S. Cl.
CPC ........... *H03G 3/3026* (2013.01); *H03G 3/3089* (2013.01)
USPC ........................... 700/94; 381/104; 455/232.1

(58) Field of Classification Search
USPC .......................................................... 700/94
See application file for complete search history.

(56) References Cited

U.S. PATENT DOCUMENTS

| 6,751,177 | B1 * | 6/2004 | Abe et al. .................. 369/59.21 |
| 7,949,419 | B2 * | 5/2011 | Kong et al. ..................... 700/94 |
| 2003/0083031 | A1 * | 5/2003 | Eriksson et al. ........... 455/250.1 |
| 2006/0246942 | A1 * | 11/2006 | Ramachandran et al. . 455/553.1 |

* cited by examiner

*Primary Examiner* — Joseph Saunders, Jr.
(74) *Attorney, Agent, or Firm* — Sterne, Kessler, Goldstein & Fox PLLC

(57) ABSTRACT

Methods and systems for processing audio signals are disclosed herein. Aspects of the method may comprise controlling gain during multipath, multi-rate audio processing by generating a digital signal that is a product of an input digital signal and a gain coefficient derived from a lookup table, and coarse tuning the gain by bit-shifting the digital signal to generate a digital output signal. The gain may be fine-tuned utilizing a variable step size determined by interpolation. The gain coefficient may be partitioned into gain blocks, which may be twice a corresponding value in preceding gain blocks. The gain blocks may be partitioned into steps that represent particular gain values within a range associated with the gain block. The digital output signal may be ramped utilizing a linear interpolation of the gain coefficients over a number of samples of the input signal, where the number of samples is given as a power of two.

21 Claims, 10 Drawing Sheets

CONTROLLING GAIN DURING MULTIPATH MULTI-RATE AUDIO PROCESSING

CROSS-REFERENCE TO RELATED APPLICATIONS/INCORPORATION BY REFERENCE

This application is a continuation of application 11/565,358 filed on Nov. 30, 2006, which is hereby incorporated herein by reference in its entirety. This application makes reference to:
U.S. patent application Ser. No. 11/565,414 filed on Nov. 30, 2006;
U.S. patent application Ser. No. 11/565,342 filed on Nov. 30, 2006;
U.S patent application Ser. No. 11/565,373 filed on Nov. 30, 2006;
U.S patent application Ser. No. 11/565,591 filed on Nov. 30, 2006; and
U.S patent application Ser. No. 11/565,576 filed on Nov. 30, 2006.

Each of the above stated applications is hereby incorporated by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing digital audio signals. More specifically, certain embodiments of the invention relate to a method and system for controlling gain during multipath, multi-rate audio processing.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may utilize audio coding and decoding (codec) devices that provide appropriate gain, filtering, and/or analog-to-digital conversion in the uplink direction to circuitry and/or software that provides audio processing and may also provide appropriate gain, filtering, and/or digital-to-analog conversion in the downlink direction to the output devices.

As audio applications expand, such as new voice and/or audio compression techniques and formats, for example, and as they become embedded into wireless systems, such as mobile phones, for example, novel codec devices may be needed that may provide appropriate processing capabilities to handle the wide range of audio signals and audio signal sources. In this regard, added functionalities and/or capabilities may also be needed to provide users with the flexibilities that new communication and multimedia technologies provide. Moreover, these added functionalities and/or capabilities may need to be implemented in an efficient and flexible manner given the complexity in operational requirements, communication technologies, and the wide range of audio signal sources that may be supported by mobile phones.

The audio inputs to mobile phones may come from a variety of sources, at a number of different sampling rates, and audio quality. Polyphonic ringers, voice, and high quality audio, such as music, are sources that are typically processed in a mobile phone system. The different quality of the audio source places different requirements on the processing circuitry, thus dictating flexibility in the audio processing systems.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for controlling gain during multipath, multi-rate audio processing, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for processing audio signals. In this regard, a multipath may refer to the use of multiple processing paths that may be enabled for processing audio signals received from a plurality of sources. Moreover, a multi-rate may refer to enabling the reception of audio signals in a plurality of sampling rates and converting them to different sampling rates in accordance with the processing requirements. Aspects of the method may comprise generating a digital signal that is a product of an input digital signal and a gain coefficient derived from a lookup table, and bit-shifting this digital signal to generate a digital output signal utilizing a digital gain circuit. The gain coefficient may be partitioned into a number of gain blocks, with each block covering a gain change factor of 2. Therefore, the gain values in each of the gain blocks may be twice a corresponding value in each preceding gain block. The gain blocks may be partitioned into a plurality of steps, where each step represents a minimum change in the digital gain coefficient, for example, 0.25 dB. The steps within a gain block may be stored in a lookup table. The digital output signal may be ramped by the digital gain circuit. The ramping may be determined utilizing a linear interpolation of the gain coefficients one step apart. The rate of ramping may be adjustable, where the ramping rate may be defined as a magnitude change of the digital output signal due to one step change of the digital gain coefficient divided by a number of samples of the digital input signal over which the change takes place, where the number of samples is given as a power of two.

Figure 1:
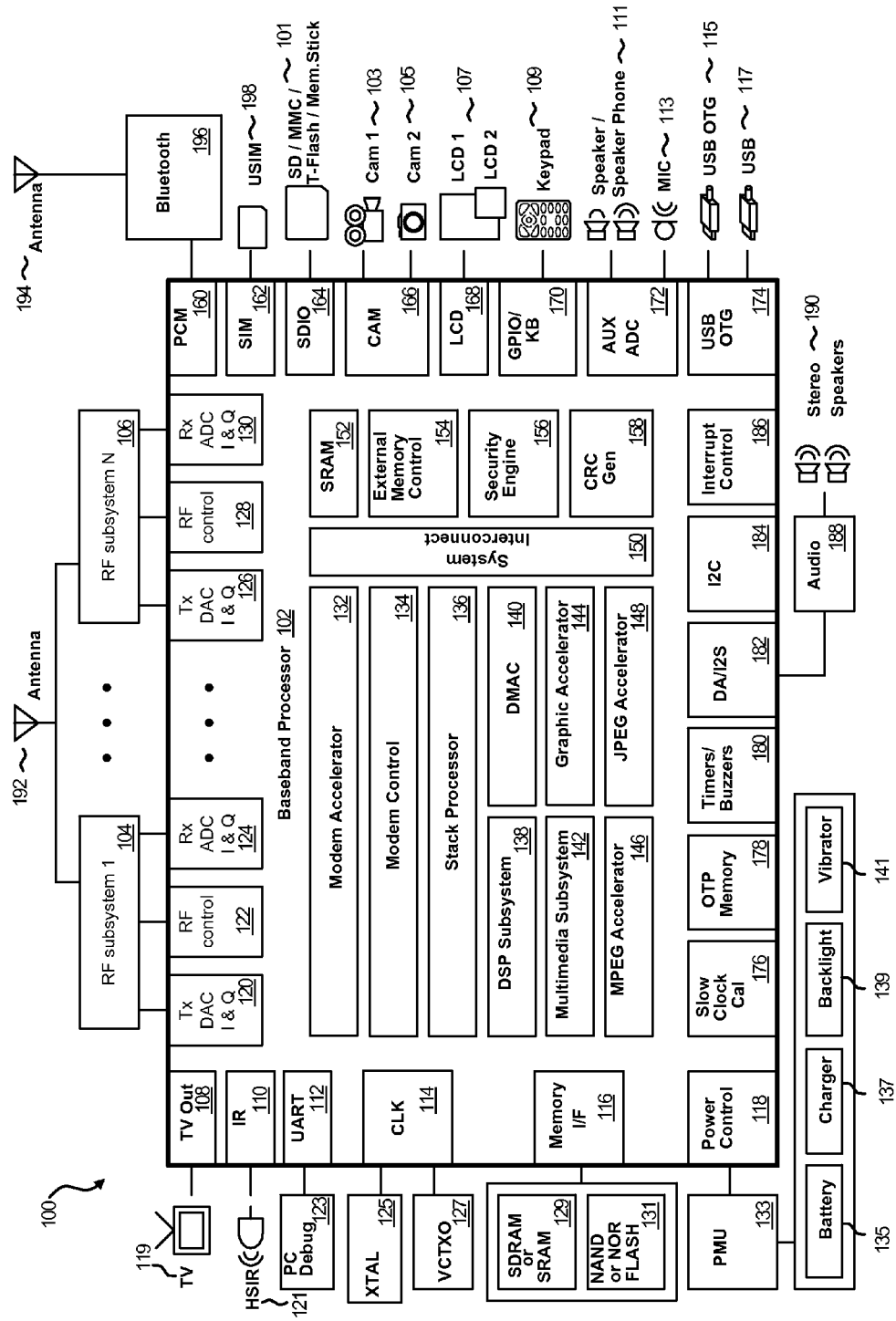
FIG. 1 is a block diagram that illustrates an exemplary multimedia baseband processor that enables handling of a plurality of wireless protocols, in accordance with an embodiment of the invention.

FIG. 1 is a block diagram that illustrates an exemplary multimedia baseband processor that enables handling of a plurality of wireless protocols, in accordance with an embodiment of the invention. Referring to FIG. 1, there is shown a wireless system 100 that may correspond to a wireless handheld device, for example. In this regard, the U.S. application Ser. No. 11/354,704, filed Feb. 14, 2006, discloses a method and system for a processor that handles a plurality of wireless access communication protocols, and is hereby incorporated herein by reference in its entirety. The wireless system 100 may comprise a baseband processor 102 and a plurality of RF subsystems 104, . . . , 106. In this regard, an RF subsystem may correspond to a WCDMA/HSDPA RF subsystem or to a GSM/GPRS/EDGE RF subsystem, for example. The wireless system 100 may also comprise a Bluetooth radio 196, a plurality of antennas 192 and 194, a TV 119, a high-speed infra-red (HSIR) 121, a PC debug block 123, a plurality of crystal oscillators 125 and 127, a SDRAM block 129, a NAND block 131, a power management unit (PMU) 133, a battery 135, a charger 137, a backlight 139, and a vibrator 141. The Bluetooth radio 196 may be coupled to an antenna 194. The Bluetooth radio 196 may be integrated within a single chip. The wireless system 100 may further comprise an audio block 188, one or more such as speakers 190, one or more USB devices such as USB devices 117 and 119, a microphone (MIC) 113, a speaker phone 111, a keypad 109, one or more displays such as LCD's 107, one or more cameras such as cameras 103 and 105, a removable memory such as memory stick 101, and a UMTS subscriber identification module (USIM) 198.

The baseband processor 102 may comprise a TV out block 108, an infrared (IR) block 110, a universal asynchronous receiver/transmitter (UART) 112, a clock (CLK) 114, a memory interface 116, a power control block 118, a slow clock block 176, a OTP memory block 178, timers block 180, an inter-integrated circuit sound (I2S) interface block 182, an inter-integrated circuit (I2C) interface block 184, an interrupt control block 186. The baseband processor 102 may further comprise a USB on-the-go (OTG) block 174, a AUX ADC block 172, a general-purpose I/O (GPIO) block 170, a LCD block 168, a camera block 166, a SDIO block 164, a SIM interface 162, and a pulse code modulation (PCM) block 160.

The baseband processor 102 may communicate with the Bluetooth radio 196 via the PCM block 160, and in some instances, via the UART 112 and/or the I2S block 182, for example.

The baseband processor 102 may further comprise a plurality of transmit (Tx) digital-to-analog converter (DAC) for in-phase (I) and quadrature (Q) signal components 120, . . . , 126, plurality of RF control 122, . . . , 128, and a plurality of receive (Rx) analog-to-digital converter (ADC) for I and Q signal components 124, . . . , 130. In this regard, receive, control, and/or transmit operations may be based on the type of transmission technology, such as EDGE, HSDPA, and/or WCDMA, for example. The baseband processor 602 may also comprise an SRAM block 152, an external memory control block 154, a security engine block 156, a CRC generator block 158, a system interconnect 150, a modem accelerator 132, a modem control block 134, a stack processor block 136, a DSP subsystem 138, a DMAC block 140, a multimedia subsystem 142, a graphic accelerator 144, an MPEG accelerator 146, and a JPEG accelerator 148. Notwithstanding the wireless system 100 disclosed in FIG. 1, aspects of the invention need not be so limited.

Figure 2A:
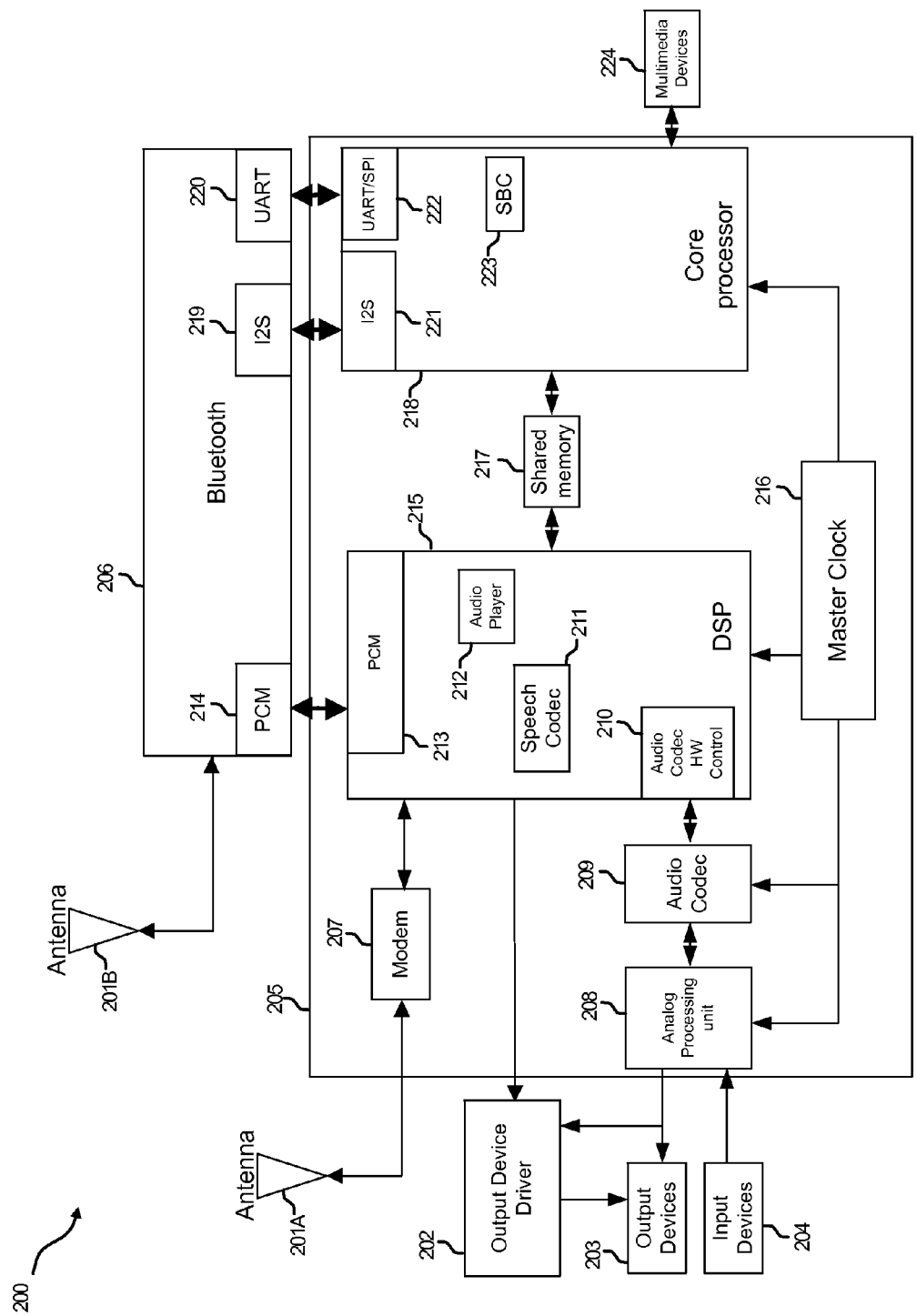
FIG. 2A is a block diagram illustrating an exemplary multimedia baseband processor communicatively coupled to a Bluetooth radio, in accordance with an embodiment of the invention

FIG. 2A is a block diagram illustrating an exemplary multimedia baseband processor communicatively coupled to a Bluetooth radio, in accordance with an embodiment of the invention. Referring to FIG. 2A, there is shown a wireless system 200 that may comprise a baseband processor 205, antennas 201a and 201b, a Bluetooth radio 206, an output device driver 202, output devices 203, input devices 204, and multimedia devices 224. The wireless system 200 may comprise similar components as those disclosed for the wireless system 100 in FIG. 1. The baseband processor 205 may comprise a modem 207, a digital signal processor (DSP) 215, a shared memory 217, a core processor 218, an audio coder/decoder unit (codec) 209, an analog processing unit 208, and a master clock 216. The core processor 218 may be, for example, an ARM processor integrated within the baseband processor 205. The DSP 215 may comprise a speech codec 211, an audio player 212, a PCM block 213, and an audio codec hardware control 210. The core processor 218 may comprise an I2S block 221, a UART and serial peripheral interface (UART/SPI) block 222, and a sub-band coding (SBC) codec 223. The Bluetooth radio 206 may comprise a PCM block 214, an I2S block 219, and a UART 220.

The antennas 201a and 210b may comprise suitable logic circuitry, and/or code that may enable wireless signals transmission and/or reception. The output device driver 202 may comprise suitable logic, circuitry, and/or code that may enable controlling the operation of the output devices 203. In this regard, the output device driver 202 may receive at least one signal from the DSP 215 and/or may utilize at least one signal generated by the analog processing unit 208. The output devices 203 may comprise suitable logic, circuitry, and/or code that may enable playing, storing, and/or communicating analog audio, voice, polyringer, and/or mixed signals from the analog processing unit 208. The output devices 203 may comprise speakers, speaker phones, stereo speakers, headphones, and/or storage devices such as audio tapes, for example. The input devices 204 may comprise suitable logic, circuitry, and/or code that may enable receiving of analog audio and/or voice data and communicating it to the analog processing unit 208 for processing. The input devices 204 may comprise one or more microphones and/or auxiliary microphones, for example. The multimedia devices 224 may comprise suitable logic, circuitry, and/or code that may be enable communication of multimedia data with the core processor 218 in the baseband processor 205. The multimedia devices 224 may comprise cameras, video recorders, video displays, and/or storage devices such as memory sticks, for example.

The Bluetooth radio 206 may comprise suitable logic, circuitry, and/or code that may enable transmission, reception, and/or processing of information by utilizing the Bluetooth radio protocol. In this regard, the Bluetooth radio 206 may support amplification, filtering, modulation, and/or demodulation operations, for example. The Bluetooth radio 206 may enable data to be transferred from and/or to the baseband processor 205 via the PCM block 214, the I2S block 219, and/or the UART 220, for example. In this regard, the Bluetooth radio 206 may communicate with the DSP 215 via the PCM block 214 and with the core processor 218 via the I2S block 221 and the UART/SPI block 222.

The modem 207 in the baseband processor 205 may comprise suitable logic, circuitry, and/or code that may enable modulation and/or demodulation of signals communicated via the antenna 201a. The modem 207 may communicate with the DSP 205. The shared memory 217 may comprise suitable logic, circuitry, and/or code that may enable storage of data. The shared memory 217 may be utilized for communicating data between the DSP 215 and the core processor 218. The master clock 216 may comprise suitable logic, circuitry, and/or code that may enable generating at least one clock signal for various components of the baseband processor 205. For example, the master clock 216 may generate at least one clock signal that may be utilized by the analog processing unit 208, the audio codec 209, the DSP 215, and/or the core processor 218, for example.

The core processor 218 may comprise suitable logic, circuitry, and/or code that may enable processing of audio and/or voice data communicated with the DSP 215 via the shared memory 217. The core processor 218 may comprise suitable logic, circuitry, and/or code that may enable processing of multimedia information communicated with the multimedia devices 224. In this regard, the core processor 218 may also control at least a portion of the operations of the multimedia devices 224, such as generation of signals for controlling data transfer, for example. The core processor 218 may also enable communicating with the Bluetooth radio via the I2S block 221 and/or the UART/SPI block 222. The core processor 218 may also be utilized to control at least a portion of the operations of the baseband processor 205, for example. The SBC codec 223 in the core processor may comprise suitable logic, circuitry, and/or code that may enable coding and/or decoding audio signals, such as music or mixed audio data, for example, for communication with the Bluetooth radio 206.

The DSP 215 may comprise suitable logic, circuitry, and/or code that may enable processing of a plurality of audio signals, such as digital general audio data, digital voice data, and/or digital polyringer data, for example. In this regard, the DSP 215 may enable generation of digital polyringer data. The DSP 215 may also enable generation of at least one signal that may be utilized for controlling the operations of, for example, the output device driver 202 and/or the audio codec 209. The DSP 215 may be utilized to communicate processed audio and/or voice data to the core processor 218 and/or to the Bluetooth radio 206. The DSP 215 may also enable receiving audio and/or voice data from the Bluetooth radio 206 and/or from the multimedia devices 224 via the core processor 218 and the shared memory 217.

The speech codec 211 may comprise suitable logic, circuitry, and/or code that may enable coding and/or decoding of voice data. The audio player 212 may comprise suitable logic, circuitry, and/or code that may enable coding and/or decoding of audio or musical data. For example, the audio player 212 may be utilized to process digital audio encoding formats such as MP3, WAV, AAC, uLAW/AU, AIFF, AMR, and MIDI, for example. The audio codec hardware control 210 may comprise suitable logic, circuitry, and/or code that may enable communication with the audio codec 209. In this regard, the DSP 215 may communicate more than one audio signal to the audio codec 209 for processing. Moreover, the DSP 215 may also communicate more than one signal for controlling the operations of the audio codec 209.

The audio codec 209 may comprise suitable logic, circuitry, and/or code that may enable processing audio signals received from the DSP 215 and/or from input devices 204 via the analog processing unit 208. The audio codec 209 may enable utilizing a plurality of digital audio inputs, such as 16 or 18-bit inputs, for example. The audio codec 209 may also enable utilizing a plurality of data sampling rate inputs. For example, the audio codec 209 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The audio codec 209 may also support mixing of a plurality of audio sources. For example, the audio codec 209 may support at least three audio sources, such as general audio, polyphonic ringer, and voice. In this regard, the general audio and polyphonic ringer sources may support the plurality of sampling rates that the audio codec 209 is enabled to accept, while the voice source may support a portion of the plurality of sampling rates, such as 8 kHz and 16 kHz, for example.

The audio codec 209 may also support independent and dynamic digital volume or gain control for each of the audio sources that may be supported. The audio codec 209 may also support a mute operation that may be applied to each of the audio sources independently. The audio codec 209 may also support adjustable and programmable soft ramp-ups and ramp-down for volume control to reduce the effects of clicks and/or other noises, for example. The audio codec 209 may also enable downloading and/or programming a multi-band equalizer to be utilized in at least a portion of the audio sources. For example, a 5-band equalizer may be utilized for audio signals received from general audio and/or polyphonic ringer sources.

The audio codec 209 may also utilize a programmable infinite impulse response (IIR) filter and/or a programmable finite impulse response (FIR) filter for at least a portion of the audio sources to compensate for passband amplitude and phase fluctuation for different output devices. In this regard, filters coefficients may be configured or programmed dynamically based on current operations. Moreover, filter coefficients may all be switched in one-shot or may be switched sequentially, for example. The audio codec 209 may also utilize a modulator, such as a Delta-Sigma (Δ-Σ) modulator, for example, to code digital output signals for analog processing.

In operation, the audio codec 209 in the wireless system 200 may communicate with the DSP 215 in order to transfer audio data and control signals. Control registers for the audio codec 209 may reside within the DSP 215. For voice data, the audio samples need not be buffered between the DSP 215 and the audio codec 209. For general audio data and for polyphonic ringer path, audio samples from the DSP 215 may be written into a FIFO and then the audio codec 209 may fetch the data samples. The DSP 215 and the core processor 218 may exchange audio signals and control information via the shared memory 217. The core processor 218 may write PCM audio directly into the shared memory 217. The core processor 218 may also communicate coded audio data to the DSP 215 for computationally intensive processing. In this regard, the DSP 215 may decode the data and may writes the PCM audio signals back into the shared memory 217 for the core processor 218 to access. Moreover, the DSP 215 may decode the data and may communicate the decoded data to the audio codec 209. The core processor 218 may communicate with the audio codec 209 via the DSP 215. Notwithstanding the wireless system 200 disclosed in FIG. 2A, aspects of the invention need not be so limited.

Figure 2B:
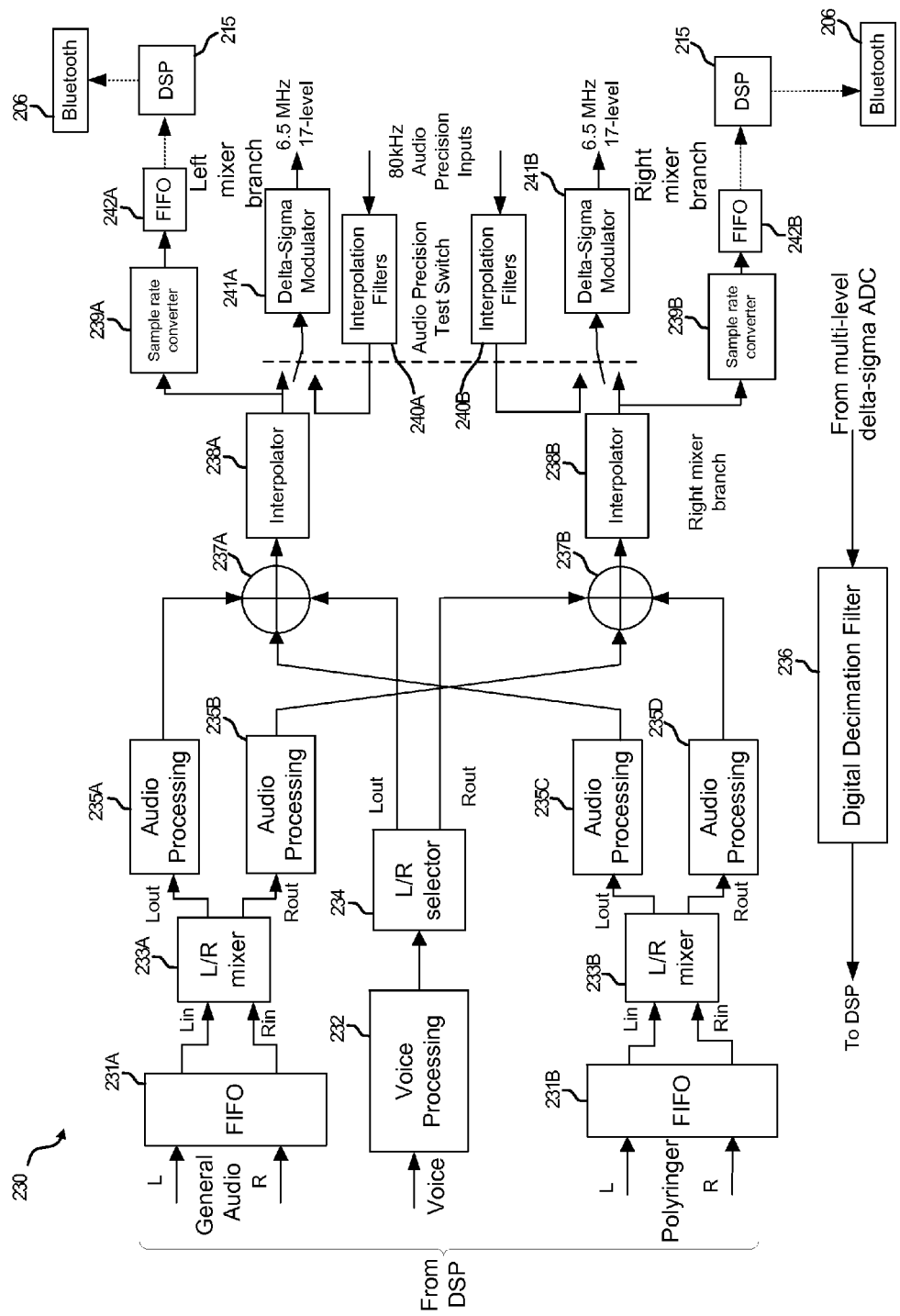
FIG. 2B is a block diagram illustrating an exemplary audio codec in a multimedia baseband processor, in accordance with an embodiment of the invention.

FIG. 2B is a block diagram illustrating an exemplary audio codec in a multimedia baseband processor, in accordance with an embodiment of the invention. Referring to FIG. 2B, there is shown an audio codec 230 that may correspond to the audio codec 209 disclosed in FIG. 2A. The audio codec 230 may comprise a first portion for communicating data from a DSP, such as the DSP 215, to output devices and/or to a Bluetooth radio, such the output devices 203 and the Bluetooth radio 206. The audio codec 230 may also comprise a second portion that may be utilized for communicating data from input devices, such as the input devices 204, to the DSP 215, for example.

The first portion of the audio codec 230 may comprise a general audio path from the DSP 215, a voice path from the DSP 215, and a polyphonic ringer or polyringer path from the DSP 215. In this regard, the audio codec 230 may utilize a separate processing path before mixing each audio source or audio source type that may be supported. The general audio path may comprise a FIFO 231A, a left and right channels (L/R) mixer 233A, a left channel audio processing block 235A, and a right channel audio processing block 235B. The voice path may comprise a voice processing block 232 and a left and right channels (L/R) selector 234. The polyringer path may comprise a FIFO 231B, an L/R mixer 233B, a left channel audio processing block 235C, and a right channel audio processing block 235D.

Regarding the general audio path and the polyringer path, the FIFOs 231A and 231B may comprise suitable logic, circuitry, and/or code that may enable storage of left and right channels audio signals from general audio source and polyringer source respectively. In this regard, each of the audio signals may be sampled at one of a plurality of sample rates that may be supported by the audio codec 230 for general audio data and/or polyringer data. The L/R mixer 233A may comprise suitable logic, circuitry, and/or code that may enable mixing the input right and left channels from the FIFO 231A to generate mixed left and right channels outputs to the audio processing blocks 235A and 235B respectively. The L/R mixer 233B may comprise suitable logic, circuitry, and/or code that may enable mixing the input right and left channels from the FIFO 231B to generate mixed left and right channels outputs to the audio processing blocks 235C and 235D respectively. The audio processing blocks 235A, 235B, 235C, and 235D may comprise suitable logic, circuitry, and/or code that may enable processing audio signals. In this regard, the audio processing blocks 235A, 235B, 235C, and/or 235D may support equalization operations, compensation operations, rate adaptation operations, and/or volume control operations, for example. The outputs of the audio processing blocks 235A and 235C may be communicated to the left channel branch mixer 237A. The outputs of the audio processing blocks 235B and 235D may be communicated to the right channel branch mixer 237B. The rate adaptation operations enable the outputs of the audio processing blocks 235A, 235B, 235C, and 235D to be at the same sampling rate when communicated to the mixers 237A and 237B.

Regarding the voice path, the voice processing block 232 may comprise suitable logic, circuitry, and/or code that may enable processing voice received from the DSP 215 in one of a plurality of voice sampling rates supported by the audio codec 230. In this regard, the voice processing block 232 may support compensation operations, rate adaptation operations, and/or volume control operations, for example. The L/R selector 234 may comprise suitable logic, circuitry, and/or code that may enable separating the voice signal contents into a right channel signal that may be communicated to the mixer 237B and a left channel signal that may be communicated to the mixer 237A. The rate adaptation operation may enable the outputs of the voice processing blocks 232 to be at the same sampling rate as the outputs of the audio processing blocks 235A, 235B, 235C, and/or 235D when communicated to the mixers 237A and 237B. For example, the input signals to the mixers 237A and 237B may be adjusted via up and/or down sampling in the audio processing blocks 235A, 235B, 235C, and 235D and the voice processing block 232 to have the same sampling rates.

The mixer 237A may comprise suitable logic, circuitry, and/or code that may enable mixing the outputs of the audio processing blocks 235A and 235C and the left channel output of the L/R selector 234. The mixer 237B may comprise suitable logic, circuitry, and/or code that may enable mixing the outputs of the audio processing blocks 235B and 235D and the right channel output of the L/R selector 234. The output of the mixer 237A may be associated with the left channel branch of the audio codec 230 while the output of the mixer 237B may be associated with the right channel branch of the audio codec 230. Also associated with the left channel branch may be an interpolator 238A, a sample rate converter 239A, a FIFO 242A, a $\Delta\text{-}\Sigma$ modulator 241A, and an interpolation filter 240A. Also associated with the right channel branch may be an interpolator 238B, a sample rate converter 239B, a FIFO 242B, a $\Delta\text{-}\Sigma$ modulator 241B, and an interpolation filter 240B. The interpolation filters 240A and 240B may be optional and may be utilized for testing, for example, to interface to audio testing equipment using the Audio Precision interface or any other interfaces adopted in the industry.

The interpolators 238A and 238B may comprise suitable logic, circuitry, and/or code that may enable up-sampling of the outputs of the mixers 237A and 237B. The sample rate converters 239A and 239B may comprise suitable logic, circuitry, and/or code that may enable adjusting the output signals from the interpolators 238A and 239B to a sampling rate that may be utilized by the DSP 215 and/or the core processor 218 for communication to the Bluetooth radio 206. In this regard, the sample rate converters 239A and 239B may adjust the sampling rates to 44.1 kHz or 48 kHz, for example, for subsequent communication to the Bluetooth radio 206. The sample rate converters 239A and 239B may be implemented as interpolators, such as linear interpolators, or more sophisticated decimation filters, for example. The audio and/or voice signal outputs from the sample rate converters 239A and 239B may be communicated to FIFOs 242A and 242B before being communicated to the DSP 215 and/or core processor 218 and later to the Bluetooth radio 206. The $\Delta\text{-}\Sigma$ modulators 241A and 241B may comprise suitable logic, circuitry, and/or code that may enable further bitwidth reduction of the outputs of the interpolators 238A and 238B to achieve a specified level output signal. For example, the $\Delta\text{-}\Sigma$ modulators 241A and 241B may receive 23-bit 6.5 MHz signals from the interpolators 238A and 238B and may further reduce the signal levels to generate 6.5 MHz 17-level signals, for example.

The second portion of the audio codec 230 may comprise a digital decimation filter 236. The digital decimation filter 236 may comprise suitable logic, circuitry, and/or code that may enable processing a digital audio signal received from the analog processing unit 208, for example, before communicating the processed audio signal to the DSP 215. The digital decimation filter 236 may comprise FIR decimation filters or CIC decimation filters that may be followed by a plurality of IIR compensation and decimation filters, for example.

Figure 2C:
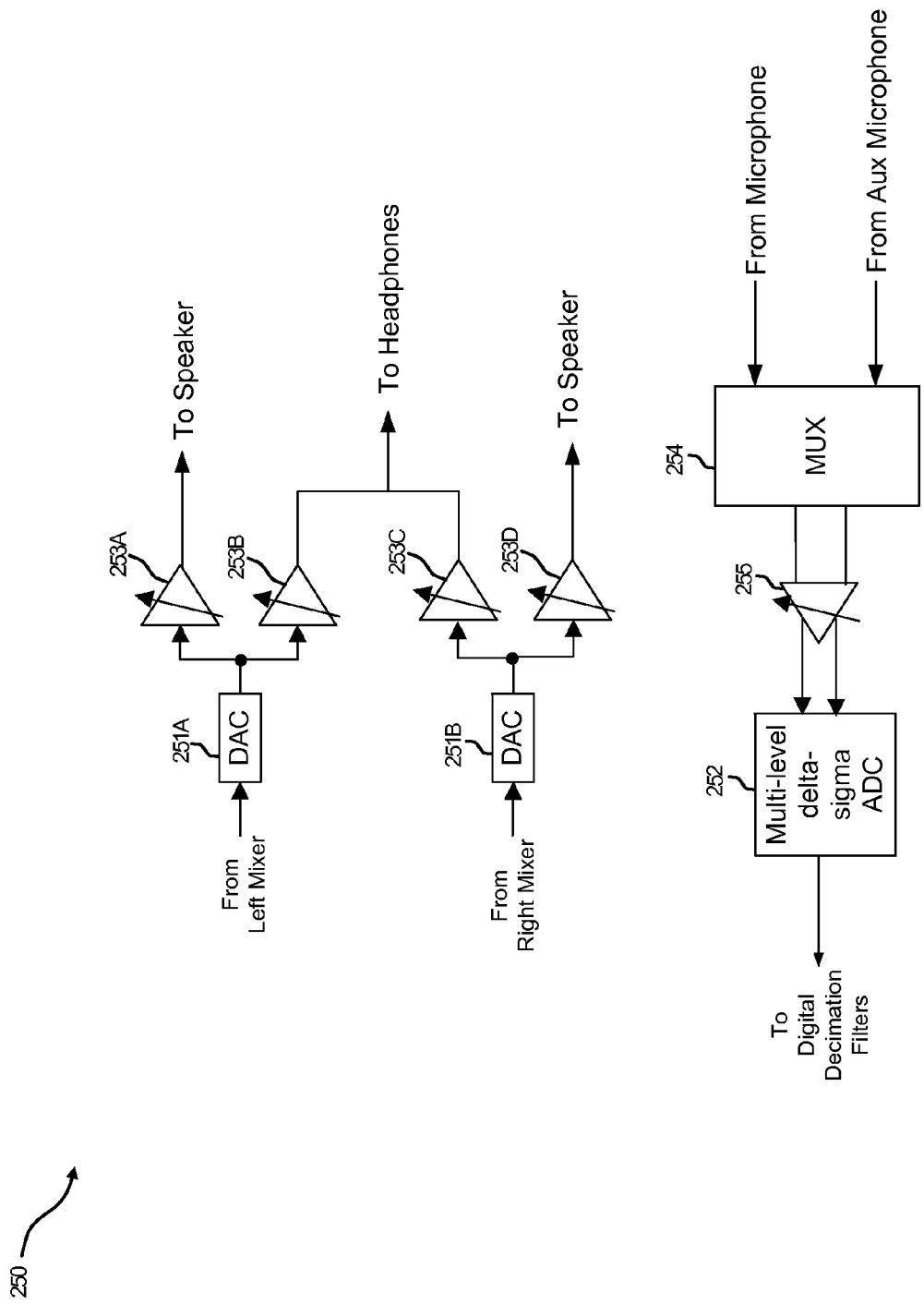
FIG. 2C is a block diagram illustrating an exemplary analog processing unit in a multimedia baseband processor, in accordance with an embodiment of the invention.

FIG. 2C is a block diagram illustrating an exemplary analog processing unit in a multimedia baseband processor, in accordance with an embodiment of the invention. Referring to FIG. 2C, there is shown an analog processing unit 250 that may correspond to the analog processing unit 208 in FIG. 2A. The analog processing unit 250 may comprise a first portion for digital-to-analog conversion and a second portion for analog-to-digital conversion. The first portion may comprise a first digital-to-analog converter (DAC) 251A and a second DAC 251B that may each comprise suitable logic, circuitry, and/or code that may enable converting digital signals from the left and the right mixer branches in the audio codec 230, respectively, to analog signals. The output of the DAC 251A may be communicated to the variable gain amplifiers 253A and 253B. The output of the DAC 251B may be communicated to the variable gain amplifiers 253C and 253D. The variable gain amplifiers 253A, 253B, 253C, and 253D may each comprise suitable logic, circuitry, and/or code that may enable dynamic variation of the gain applied to their corresponding input signals. The output of the amplifier 253A may be communicated to at least one left speaker while the output of the amplifier 253D may be communicated to at least one right speaker, for example. The outputs of amplifiers 253B and 253D may be combined and communicated to a set of headphones, for example.

The second portion of the analog processing unit 250 may comprise a multiplexer (MUX) 254, a variable gain amplifier 255, and a multi-level Delta-Sigma ($\Delta$-$\Sigma$) analog-to-digital converter (ADC) 252. The MUX 254 may comprise suitable logic, circuitry, and/or code that may enable selection of an input analog signal from a microphone or from an auxiliary microphone, for example. The variable gain amplifier 255 may comprise suitable logic, circuitry, and/or code that may enable dynamic variation of the gain applied to the analog output of the MUX 254. The multi-level $\Delta$-$\Sigma$ ADC 252 may comprise suitable logic, circuitry, and/or code that may enable conversion of the amplified output of the variable gain amplifier 255 to a digital signal that may be communicated to the digital decimation filter 236 in the audio codec 230 disclosed in FIG. 2B. In some instances, the multi-level $\Delta$-$\Sigma$ ADC 252 may be implemented as a 3-level $\Delta$-$\Sigma$ ADC, for example. Notwithstanding the exemplary analog processing unit 250 disclosed in FIG. 2C, aspects of the invention need not be so limited.

Figure 2D:
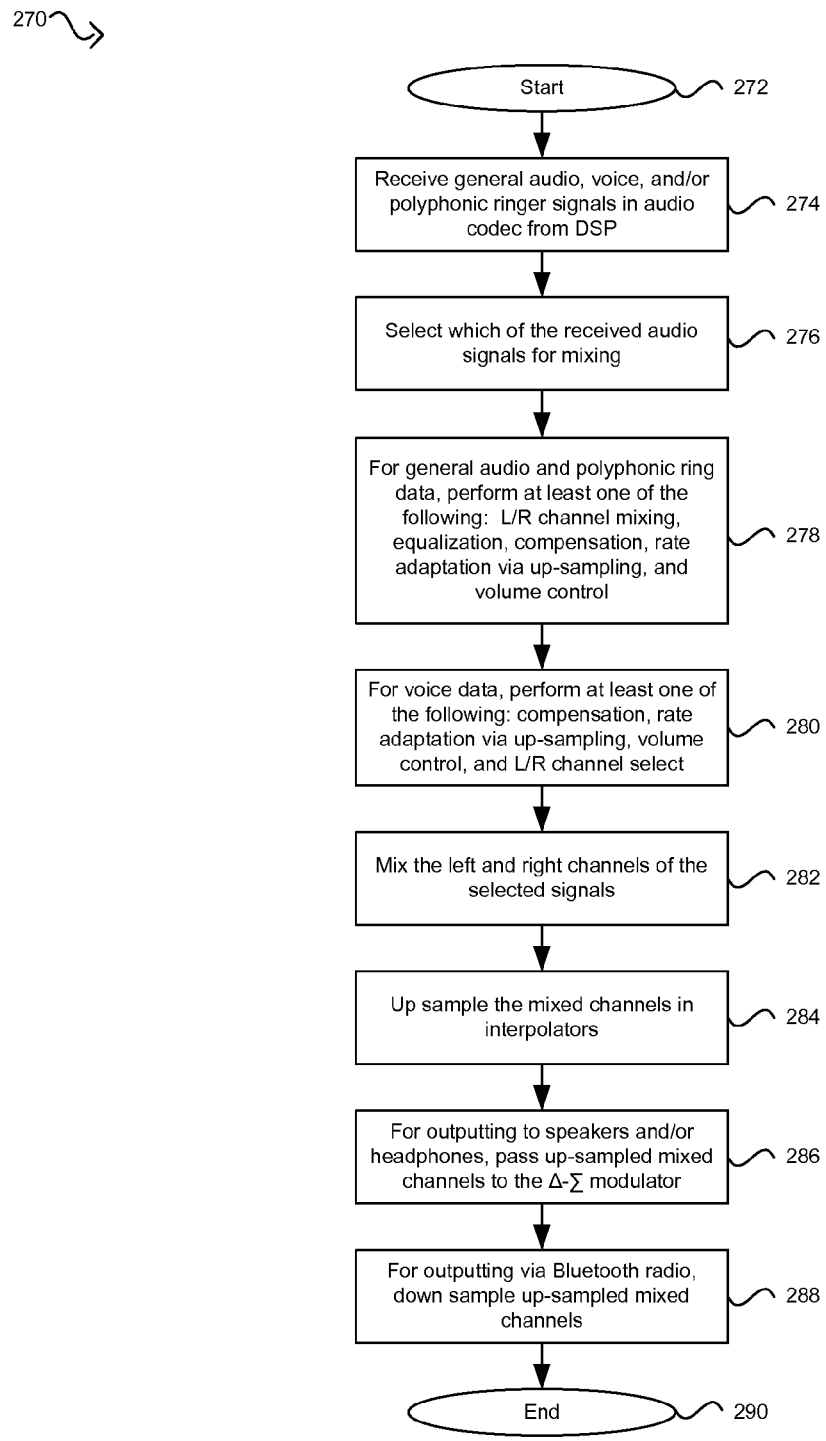
FIG. 2D is a flow diagram illustrating exemplary steps for data mixing in the audio codec, in accordance with an embodiment of the invention.

FIG. 2D is a flow diagram illustrating exemplary steps for data mixing in the audio codec, in accordance with an embodiment of the invention. Referring to FIG. 2D, there is shown a flow 270. After start step 272, in step 274, the audio codec 230 disclosed in FIG. 2B may receive two or more audio signals from a general audio source, a polyphonic ringer audio source, and/or a voice audio source via the DSP 215, for example. In step 276, the audio codec 230 may be utilized to select two or more of the received audio signals for mixing. In this regard, portions of the audio codec 230 may be programmed, adjusted, and/or controlled to enable selected audio signals to be mixed. For example, a mute operation may be utilized to determine which audio signals may be mixed in the audio codec 230.

In step 278, when the audio signals to be mixed comprises general audio and/or polyphonic ringer audio, the signals may be processed in the audio processing blocks 235A, 235B, 235C, and 235D where equalization operations, compensation operations, rate adaptation operations, and/or volume control operations may be performed on the signals. Regarding the rate adaptation operations, the data sampling rate of the input general audio or polyphonic ringer audio signals may be adapted to a specified sampling rate for mixing. In step 280, when one of the audio signals to be mixed comprises voice, the voice signal may be processed in the voice processing block 232 where compensation operations, rate adaptation operations, and/or volume control operations may be performed on the voice signals. Regarding the rate adaptation operations, the data sampling rate of the input voice signals may be adapted to specified sampling rate for mixing.

In step 282, the left channel general audio and polyringer signals generated by the audio processing blocks 235A and 235C and the left channel voice signals generated by the L/R selector 234 may be mixed in the mixer 237A. Similarly, the right channel general audio and polyringer signals generated by the audio processing blocks 235B and 235D and the right channel voice signals generated by the L/R selector 234 may be mixed in the mixer 237B. In step 284, the outputs of the mixers 237A and 237B corresponding to the mixed left and right channel signals may be up-sampled by the interpolators 238A and 238B respectively. By generating signals with a higher sampling rate after mixing, the implementation of the sample rate converters 239A and 239B may also be simplified.

In step 286, when communicating the up-sampled mixed left and right channels signals to output devices, such as the output devices 203 disclosed in FIG. 2A, the audio codec 230 may utilize the $\Delta$-$\Sigma$ modulators 241A and 241B to reduce the digital audio signals to signals with much fewer but appropriate levels. In this regard, the output signals may be communicated to the DACs 251A and 251B and to the variable gain amplifiers 253A, 253B, 253C, and 253D disclosed in FIG. 2C for analog conversion and for signal gain respectively. In step 288, when communicating the up-sampled mixed left and right channel signals to the Bluetooth radio 206, the audio codec 230 may down-sample the audio signals by utilizing the sample rate converters 239A and 239B and then communicating the down-sampled signals to the FIFOs 242A and 242B. The DSP 215 may fetch the down-sampled audio signals from the FIFOs 242A and 242B and may then communicate the digital audio signals to the Bluetooth radio 206. Notwithstanding the exemplary steps for mixing audio sources disclosed in FIG. 2D, aspects of the invention need not be so limited.

Figure 3:
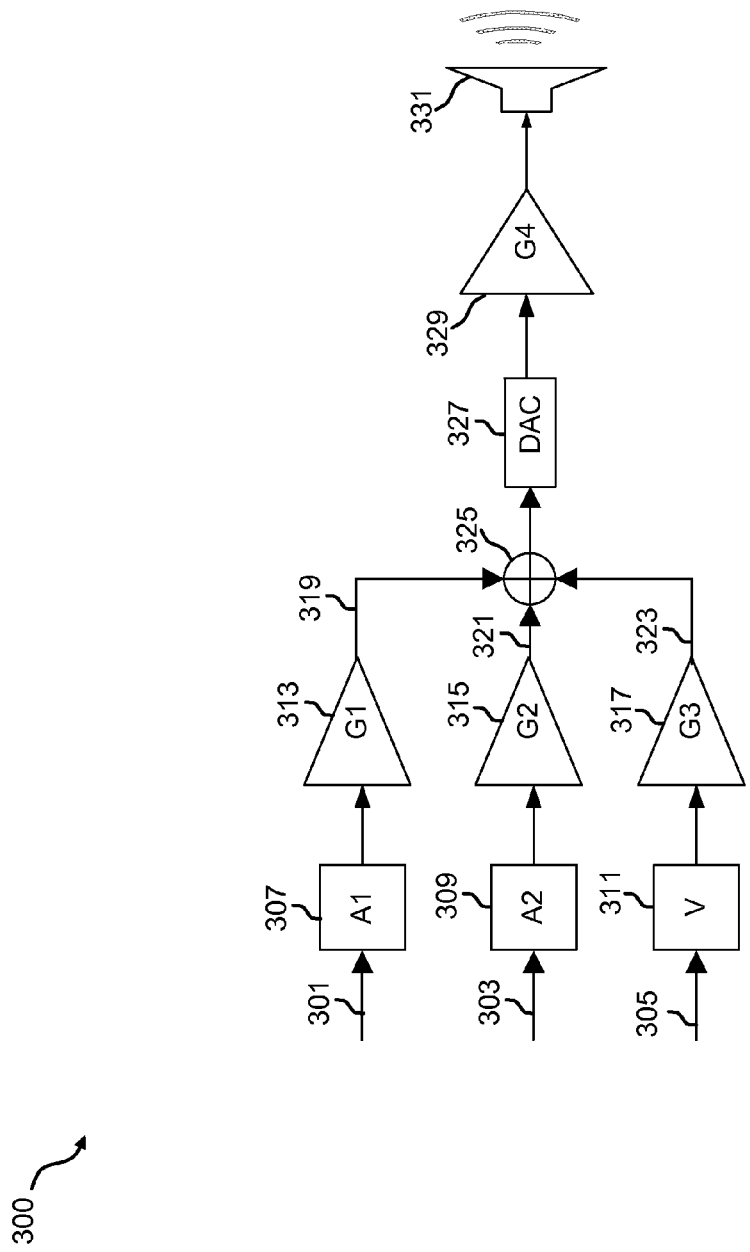
FIG. 3 is a block diagram of an exemplary audio processing unit in accordance with an embodiment of the invention.

FIG. 3 is a block diagram of an exemplary audio processing unit in accordance with an embodiment of the invention. Referring to FIG. 3, there is shown digital input signals 301, 303 and 305, an audio path 1 processing block A1 307, an audio path 2 processing block A2 309 and a voice processing block V 311, digital gain adjustment blocks 313, 315 and 317, a mixer 325, a digital to analog converter (DAC) 327, an output amplifier G4 329, and a speaker 331. The digital input signals 301, 303, and 305 may be for two audio paths plus a voice path in an audio codec chip, for example. The audio path processing and voice processing blocks 307, 309 and 311 may comprise suitable logic, circuitry and/or code to process incoming digital input signals. The processing of incoming digital input signals may comprise equalization, compensation and/or sampling rate adaptation (via interpolation and decimation), for example.

The digital gain adjustment blocks 313, 315 and 317 may comprise suitable logic, circuitry and/or code to apply a variable gain to incoming digital signals, with digital output signals proportional to the digital input signals multiplied by the gain. The mixer 325 may comprise suitable logic, circuitry and/or code for mixing of multiple signals into one output signal. The DAC 327 may comprise suitable logic, circuitry and/or code for additional sampling rate changes and for converting a digital input signal to an analog output signal. The output amplifier G4 329 may comprise suitable logic, circuitry and/or code for amplifying an analog input signal making it suitable for playback on output devices such as speaker 331, for example. The digital input signals 301, 303 and 305 may be communicated to audio and voice processing blocks 307, 309 and 311 which may be coupled to digital gain adjustment blocks 313, 315 and 317. The digital gain adjustment blocks 313, 315 and 317 may be coupled to mixer 325. The output signal of mixer 325 may be communicated to DAC 327. The output of DAC 327 may be communicated to the output amplifier 329 which then communicates the amplified signal to the speaker 331.

In operation, digital audio signals 301, 303, and 305 may be communicated to the audio processing blocks 307, 309 and 311. In an exemplary embodiment of the invention, the digital input signals 301, 303 and 305 may comprise a general audio path (stereo), a polyphonic ringer path, and a voice path, respectively. The signals may be at a plurality of sample rates, 8, 12 16, 24, 32, and 48 kHz and 11.025, 22.05 and 44.1 kHz, and may be 16, 18, 20, or 24-bit signals, for example. In the audio processing blocks 307, 309 and 311, the signals may be equalized such that certain frequency bands may be selectively enhanced. In addition, the digital input signals may be communicated to a compensation filter, where the digital input signals 301, 303, and 305 may be conditioned to compensate for distortion that may be introduced by audio output devices. The digital input signals 301, 303 and 305 may also be rate adapted utilizing, for example, half-band interpolators to up-convert the incoming frequencies to reduce the total number of sampling frequencies from nine to three, followed by a polynomial decimator that reduces the total number of sampling frequencies form three to one.

The output signals from the audio processing blocks 307, 309 and 311 may be communicated to the digital gain adjustment blocks 313, 315, and 317 where gain may be applied to the signals. The digital signals 319, 321 and 323 may be provided as inputs to mixer 325. The mixer 325 may generate a single digital output signal from the digital signals 319, 321 and 323. The single digital output signal generated by the mixer 325 may be provided as an input to the DAC 327. The DAC 327 may convert the digital signal from the output of the mixer 325 to an analog signal. The analog signal generated by the DAC 327 may be amplified by output amplifier 329. The output generated by the amplifier 329 may be an analog audio signal suitable for playback on the speaker 331 or any other device such as an earplug.

Figure 4:
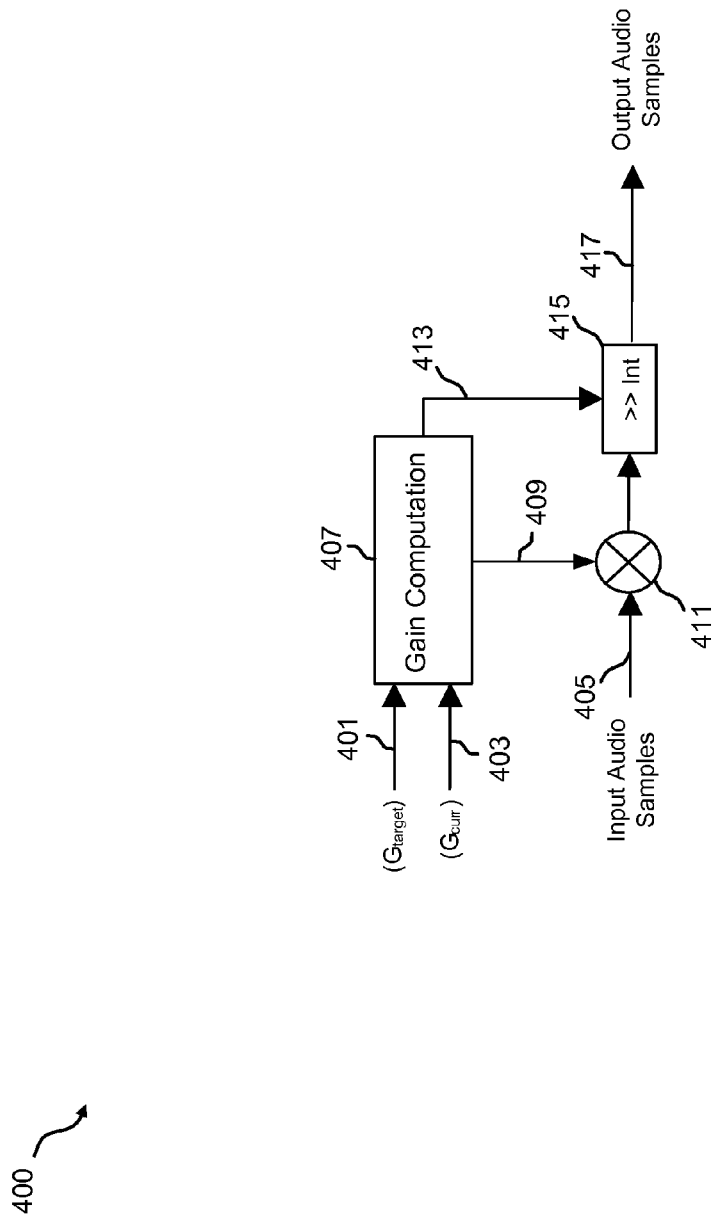
FIG. 4 is a block diagram of a digital gain adjustment block, in accordance with an embodiment of the invention.

FIG. 4 is a block diagram of a digital gain adjustment block, in accordance with an embodiment of the invention. Referring to FIG. 4, there is shown digital gain adjustment block 400 comprising a gain computation block 407, a multiplier 411 and a bit shifter 415. The digital gain adjustment block 400 may be substantially similar to the digital gain adjustment blocks 313, 315 and 317 described with respect to FIG. 3. The input signals, target gain 401 and current gain 403 may be provided as inputs to the gain computation block 407. The output signal 409 from the gain computation block 407 may be communicated to an input of the multiplier 411 while the output signal 413 may be communicated to an input of the bit shifter 415. The input audio samples 405 may be provided as an input to the multiplier 411. The output of the multiplier 411 may be communicated to another input of the bit shifter 415. The output audio samples 417 may be generated as an output of the bit shifter 415.

In operation, inputs to the digital gain adjustment block 400 may be the target gain 401 and current gain 403, and input audio samples 405. The gain computation block 407 may determine a multiplier 409 and bit shift value Int 413. The multiplier 409 may be applied as a gain value to the input audio samples 405 by the multiplier 411. The output signal from the multiplier 411 may be bit shifted by the bit shifter 415 utilizing bit shift value Int 413. The output of bit shifter 415 may comprise the audio out samples 417.

In an exemplary embodiment of the invention, the range of gain coefficients of the digital gain adjustment block 400 may be 128 dB wherein 0 dB may correspond to zero attenuation and 128 dB may correspond to an attenuated signal. The gain coefficient may be partitioned into 0.25 dB steps, for a total number of 512 steps, from 0 dB to 127.5 dB, for example. These steps may be represented by a nine bit number, wherein 111111111 may represent 0 dB attenuation and 000000001 may represent 127.5 dB attenuation. In this exemplary embodiment of the invention, the gain, G, may be described by the following relation:

$$G(dB) = 6.02 * Int + (6.02/24) * Res,$$

where G may be 0, 0.25, 0.5 ..., 127, 127.5, Res may be 0, 1, 2, ..., 23, and Int may be the number of 6 dB steps above zero, or bit shift value Int 413. The value 6.02/24=0.25083, may substantially correspond to the resolution of the gain coefficient, 0.25 dB, in this example.

The value 6.02 may be determined from the dB calculation for an output to input ratio of two:

$$20 * \log(Vo/Vi) = 6.02,$$

where Vo/Vi=2.

This relation may enable the use of bit shifting, wherein each 6.02 dB step may correspond to a doubling in gain, or attenuation in this example. Thus, a multiplier 409 may determine steps within a 6.02 dB range, and bit shift value Int 413 may determine the 6.02 dB range.

Figure 5:
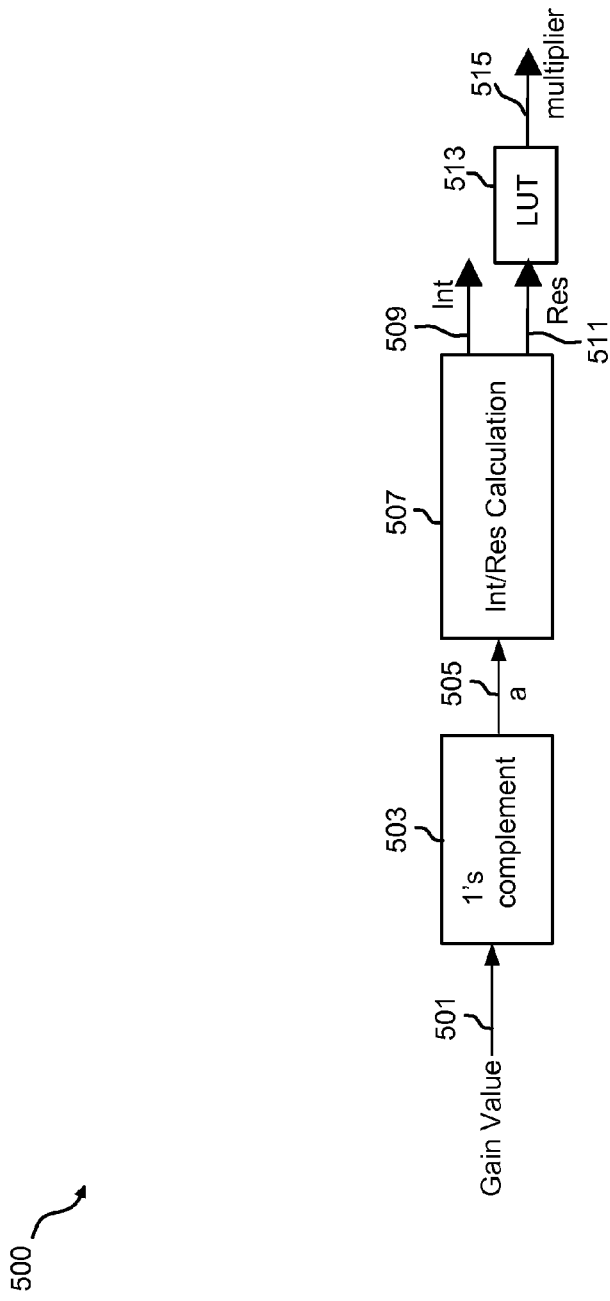
FIG. 5 is a block diagram of a digital gain computation block without soft ramp, in accordance with an embodiment of the invention.

FIG. 5 is a block diagram of a digital gain computation block without soft ramp, in accordance with an embodiment of the invention. Referring to FIG. 5, there is shown gain computation block 500, which may be substantially similar to the gain computation block 407 described with respect to FIG. 4, a 1's complement block 503, Int/Res calculation block 507, and a lookup table (LUT) block 513. The desired gain value 501, which may be represented by a 9-bit number, for example, may be provided as an input to the 1's complement block 503. The output of the 1's complement block 503 may be provided as an input to the Int/Res calculation block 507, and the output Res 511 may be provided as an input to the LUT 513. The outputs Int 509 and multiplier 515 may be substantially similar to the bit shift Int 413 and multiplier 409, respectively, described with respect to FIG. 4.

In operation, a 9-bit input value corresponding to a desired gain value 501 may be coupled to the 1's complement block 503. For example, the 1's complement of a 9-bit binary number may be illustrated as:

1's complement(111111111)=
   NOT(111111111)=000000000

The output a 505 of the 1's complement block may then be utilized by the Int/Res calculation block 507 to determine Int 509 and Res 511. Output value Int 509 may be determined using the relation:

$$Int = \text{floor}(a/24),$$

where the floor relation may be defined as the integer value of the relation a/24. For example, calculating for a value of 30, 30/24=1.25, thus floor(30/24)=1.

The output value Res 511, may be determined from the remainder of the relation a/24, which in the exemplary calculation for 30/24, the remainder may be calculated to be 6. The value Res may then be coupled to the LUT block 513 which may generate an output value multiplier 515. The contents of an exemplary LUT with 16-bit entry values are shown in Table 1.

TABLE 1

| Res | LUT output in integer format | $10^{-0.05*(6.02/24)*Res}$ |
|---|---|---|
| 0 | 32768 | 1 |
| 1 | 31835 | 0.971527099609375 |
| 2 | 30929 | 0.943878173828125 |
| 3 | 30048 | 0.9169921875 |
| 4 | 29193 | 0.890899658203125 |
| 5 | 28362 | 0.86553955078125 |
| 6 | 27554 | 0.84088134765625 |
| 7 | 26770 | 0.81695556640625 |
| 8 | 26008 | 0.793701171875 |
| 9 | 25268 | 0.7711181640625 |
| 10 | 24548 | 0.7491455078125 |
| 11 | 23849 | 0.727813720703125 |
| 12 | 23170 | 0.70709228515625 |
| 13 | 22511 | 0.686981201171875 |
| 14 | 21870 | 0.66741943359375 |
| 15 | 21247 | 0.648406982421875 |
| 16 | 20643 | 0.629974365234375 |
| 17 | 20055 | 0.612030029296875 |
| 18 | 19484 | 0.5946044921875 |
| 19 | 18929 | 0.577667236328125 |
| 20 | 18390 | 0.56121826171875 |
| 21 | 17867 | 0.545257568359375 |
| 22 | 17358 | 0.52972412109375 |
| 23 | 16864 | 0.5146484375 |
| 24 | 16384 | 0.5 |

Table 1 is an exemplary lookup table for determining gain coefficient multiplier in accordance with an embodiment of the invention.

Figure 6:
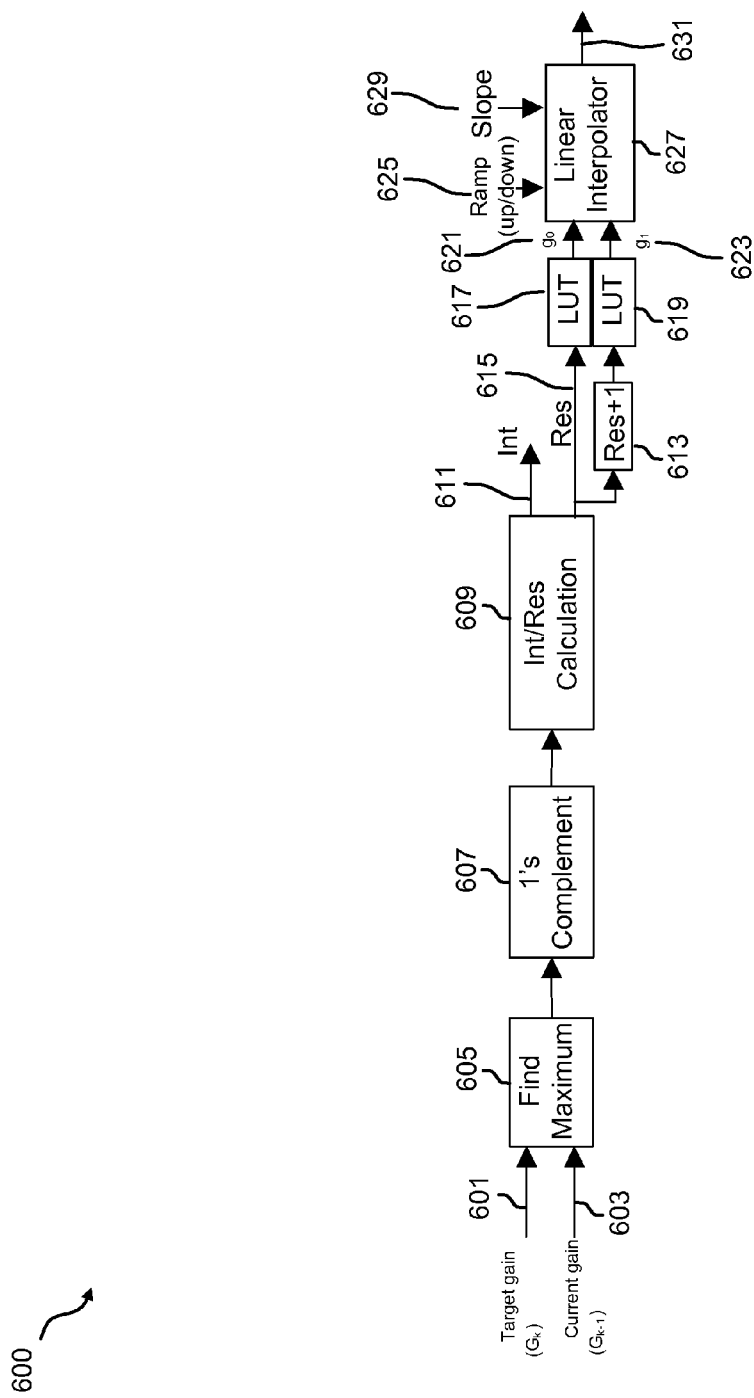
FIG. 6 is a block diagram illustrating exemplary digital gain computation in one step size change, in accordance with an embodiment of the invention.

FIG. 6 is a block diagram illustrating exemplary digital gain computation in one step size change, in accordance with an embodiment of the invention. Referring to FIG. 6, there is shown a find maximum block 605, a 1's complement block 607, an Int/Res calculation block 609, a Res+1 block 613, LUTs 617 and 619, and a linear interpolator block 627. The target gain 601 and current gain 603 may be provided as inputs to the find maximum block 605. An output of the find maximum block 605 may be provided as an input to the 1's complement block 607. The 1's complement result may be provided as an input to the Int/Res calculation block 609. The Int/Res calculation block 609 may be substantially similar to Int/Res calculation block 507 described with respect to FIG. 5, and the Int output 611 may be substantially similar to the bit shift value Int described with respect to FIG. 4 and/or output Int 509 described with respect to FIG. 5. The Res output 615 may be utilized to determine the corresponding output value g0 621 from LUT 617. The Res output 615 may also be provided as an input to the Res+1 block 613. The output of the Res+1 block 613 may be utilized to determine the corresponding output value g1 623 from the LUT 619. The output of the LUT 617, g0 621, and the LUT 619, g1 623, may be provided as inputs to the linear interpolator block 627. The inputs to the linear interpolator block 627 may also comprise Ramp 625 and Slope 629. The output 631 of the linear interpolator block 627 may be substantially similar to the multiplier value 409 described with respect to FIG. 4.

In operation, a target gain $G_k$ 601 and a current gain $G_{k-1}$ 603 may be compared to determine a maximum value utilizing the find maximum block 605. The maximum of the two input values, namely the target gain $G_k$ 601 and the current gain $G_{k-1}$ 603, may be determined by the find maximum block 605. The maximum of the two input values may be provided as an input to the 1's complement block 607, where the 1's complement operation may be applied, which may be substantially similar to the 1's complement operation described with respect to FIG. 5. The result of the 1's complement operation may be provided as an input to the Int/Res calculation block 609. The operation of the Int/Res calculation block 609 may be substantially similar to Int/Res calculation block 507 described with respect to FIG. 5. The output values Int 611 and Res 615 may be calculated in a manner substantially similar to the Int 509 and the Res 511 from the calculation block 507 as described with respect to FIG. 5. The output value Res 615, may be utilized to determine a corresponding multiplier value $g_0$ 621 from the LUT 617. In addition, the output value Res 615 may also be provided as an input to the Res+1 block 613. An output the Res+1 block 613 may be utilized to determine a corresponding multiplier value from the LUT 619. The corresponding multiplier determined from the LUT 619 may be the multiplier $g_1$ 623. The multiplier values $g_0$ 621 and $g_1$ 623 may be provided as inputs to the linear interpolator block 627. The output 631 of the linear interpolator block 627 may be substantially similar to the output multiplier 409 described with respect to FIG. 4.

In digital audio gain circuits, a "popping" or "clicking" noise may be heard in many instances due to an instantaneous change in the gain value. With the introduction of a ramp rate to the change of gain (attenuation), this popping may be reduced. The gain change from the current attenuation value $G_{k-1}$ 603 to the target value $G_k$ 601 may not occur instantly but over a number of audio samples. The number of audio samples along with the direction of the ramp, positive for a ramp up or negative for a ramp down, for example, may be inputs Ramp 625 and Slope 629 to the linear interpolator 627. In one embodiment of the invention, the number of audio samples for the gain to ramp over one step, 0.25 dB for example, may be a power of 2 (1, 2, 4, 8, 16, . . . ).

From the inputs $G_k$ 601 and $G_{k-1}$ 603, the total number of steps for the gain ramp may be determined utilizing the relationships as follows:

$$T = abs(G_{k-1} - G_k)$$

$$\text{Ramp} = G_{k-1} - G_k > 0? -1:1,$$

where $abs(G_{k-1} - G_k)$ may be the absolute value of $G_{k-1} - G_k$ and Ramp may equal −1 if $G_{k-1} - G_k > 0$ and may equal +1 if $G_{k-1} - G_k \leq 0$.

The gain at step k may be given by the following relationship:

$$G_k = G_{k-1} + k * \text{Ramp} * \text{step}$$

where step is the step size of the gain ramp, 0.25 dB for example, and k=1, 2, . . . , T. This relationship may then be utilized to determine gain values for each audio sample within step k.

Figure 7:
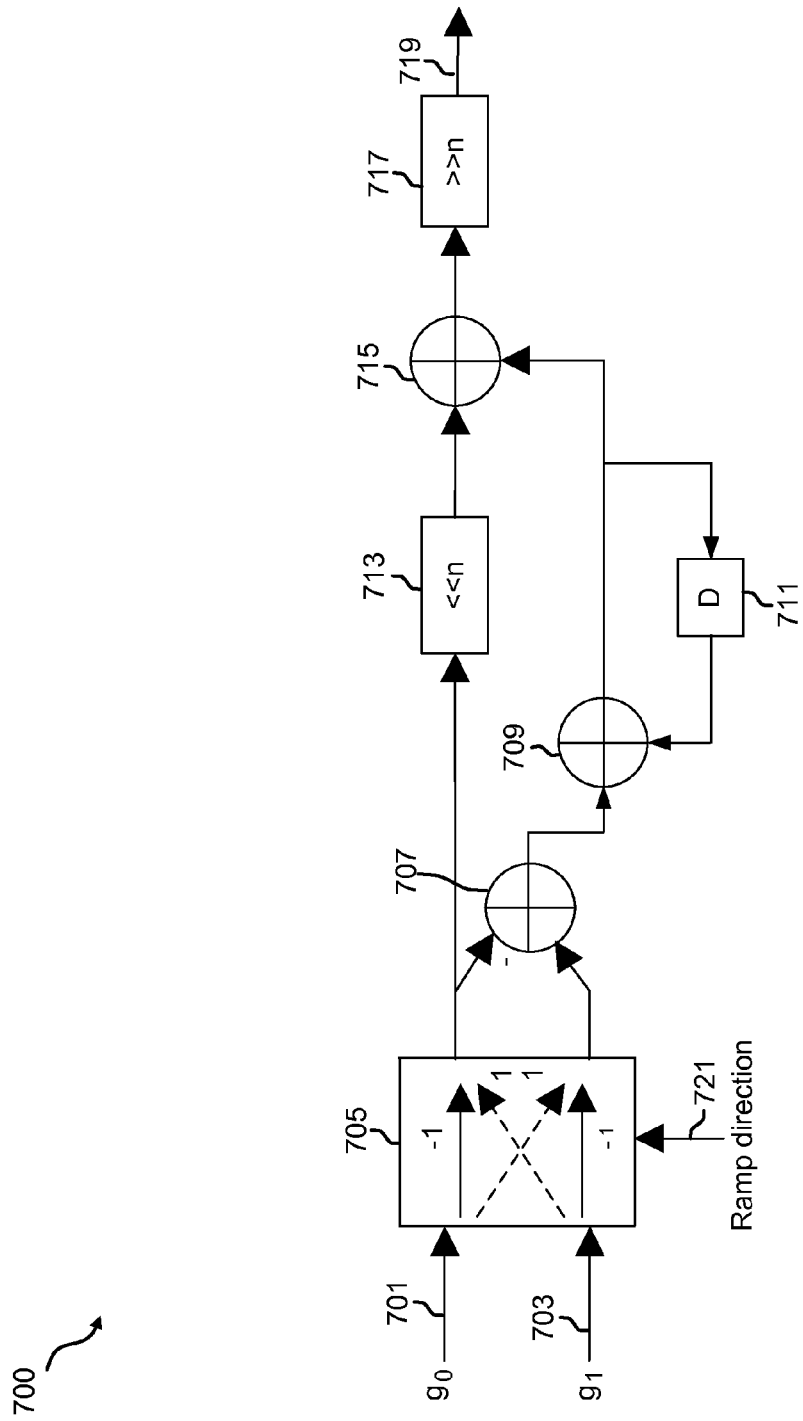
FIG. 7 is a block diagram of a digital gain computation linear interpolator, in accordance with an embodiment of the invention.

FIG. 7 is a block diagram of a digital gain computation linear interpolator, in accordance with an embodiment of the invention. Referring to FIG. 7, there is shown a ramp direction control block 705, adders 707, 709 and 715, a bit shift left block 713, a delay block 711, and a bit shift right block 717. Input gain g0 701 and g1 703 may be inputs to the ramp direction control block 705. One output of the ramp direction control block 705 may be communicated to a negative input of adder 707 and the bit shift left block 713. The other output of the ramp direction control block 705 may be communicated to another input of the adder 707. The output of the adder 707 may be communicated to an input of the adder 709, and the output of the bit shift left block 713 may be communicated to an input of the adder 715. The output of the adder 709 may also be coupled to an input of the adder 715 and to the input of delay block 711. The output of the delay block 711 may be communicated to another input of the adder 709. The output of the adder 715 may be communicated to the input of the bit shift right block 717. The output of the bit shift right block 717 may be substantially similar to the output 631 of the linear interpolator block 627 described with respect to FIG. 6.

In operation, the input values g0 701 and g1 703 may be communicated to the ramp direction control block 705. The ramp direction may be defined by the input ramp direction 721, which may be substantially similar to the Ramp 625 described with respect to FIG. 6, wherein +1 may indicate a ramp up, and −1 may indicate a ramp down. The value of the ramp direction 721 may determine which input signal, g0 701 or g1 703 may be provided as input to the bit shift left block 713 and a negative input of the adder 707, or the other input of the adder 707. In instances where the ramp direction may be equal to −1, for example, the input signal g0 701 may be communicated to the bit shift left block 713 and the negative input to the adder 707, and the input signal g1 703 may be communicated to the positive input of the adder 707. In instances where the ramp direction 721 may be equal to +1, for example, the input signal g1 703 may be communicated to the bit shift left block 713 and the negative input to the adder 707, and the input signal g0 701 may be provided as input to the positive input of the adder 707.

The sum of g1 703-g0 701, in instances where ramp direction 721 may be equal to −1, or g0 701-g1 701, in instances where ramp direction 721 may be equal to +1, may be summed at the adder 709 with the output of the adder 709 following a delay from the delay block 711. The output of the adder 709 may also be added with the output of the bit shift left block 713, which may bit shift the input signal g0 701 in instances when ramp direction 721 may be equal to −1, or input signal g1 703 in instances when the ramp direction 721 may be equal to +1. The result of this addition at adder 715 may be bit shifted right by the bit shift right block 717. The output 719 of the bit shift right block 717 may be a linear interpolation of gain step values, which may be substantially similar to the output 631 described with respect to FIG. 6.

In an embodiment of the invention, a method and system is described for generating a digital signal that may be a product of an input digital signal 405 and a gain coefficient 409 derived from a lookup table 513. The digital signal may be bit-shifted utilizing bit shifter 415 to generate a digital output signal 417. The gain coefficient 401 may be partitioned into a number of gain blocks with each gain block covering a gain change factor of 2, therefore the gain values in each of the gain blocks may be twice a corresponding value in each preceding gain block. The gain blocks may be partitioned into a plurality of steps, where each step represents a minimum change in the digital gain coefficient, for example, 0.25 dB. The steps within a gain block may be stored in a lookup table 513. The digital output signal 417 may be ramped by the digital gain circuit 313, 315 or 317. The ramping may be determined utilizing a linear interpolation of the gain coefficients one step apart. The rate of ramping may be adjustable, where the ramping rate may be defined as a magnitude change of the digital output signal due to one step change of the digital gain coefficient, divided by a number of samples of the digital input signal over which the change takes place, where the number of samples is given as a power of two.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:
1. A method for processing an input signal, the method comprising:
sampling the input signal over a period of time to provide a plurality of input signal samples;
determining, from a current gain value and a target gain value, a coarse target gain value, a fine target gain value, and a fine current gain value;

interpolating a plurality of fine gain coefficients between the fine current gain value and the fine target gain value using a lookup table;

multiplying, at an interpolation rate, each of the plurality of input signal samples by a corresponding fine gain coefficient from among the plurality of fine gain coefficients, to generate a fine tuned digital output signal; and bit-shifting the fine tuned digital output signal, using the coarse target gain value, to generate a digital output signal.

2. The method according to claim 1, comprising partitioning a set of the plurality of fine gain coefficients into a plurality of gain blocks.

3. The method according to claim 2, wherein at least one fine gain coefficient associated with at least one of the plurality of gain blocks is twice at least one fine gain coefficient associated with a preceding gain block.

4. The method according to claim 3, comprising partitioning each of the plurality of gain blocks into a plurality of steps, wherein each step represents a particular fine gain coefficient within the set of the plurality of fine gain coefficients partitioned into the corresponding gain block.

5. The method according to claim 4, wherein one of the plurality of gain blocks comprising the plurality of steps is stored in the lookup table.

6. The method according to claim 1, wherein the interpolating comprises linear interpolation between the current gain value and the fine target gain value.

7. The method according to claim 1, wherein the interpolation rate is adjustable, and
wherein the interpolation rate comprises a number of interpolated fine gain coefficients in the plurality of fine gain coefficients divided by the period of time.

8. A system for processing an input signal, the system comprising:
one or more circuits configured to:
sample the input signal into a plurality of input signal samples over a period of time;
determine, from a current gain value and a target gain value, a coarse target gain value, a fine target gain value, and a fine current gain value;
interpolate a plurality of fine gain coefficients between the fine current gain value and the fine target gain value using a lookup table;
multiple, at an interpolation rate, each of the plurality of input signal samples by a corresponding fine gain coefficient from among the plurality of fine gain coefficients, to generate a fine tuned digital output signal; and
bit shift the fine tuned digital output signal, using the coarse target gain value, to generate a digital output signal.
bit shift a fine tuned digital output signal, using the coarse target gain value, to generate a digital output signal.

9. The system according to claim 8, wherein the one or more circuits are further configured to partition a set of the plurality of fine gain coefficients into a plurality of gain blocks.

10. The system according to claim 9, wherein at least one fine gain coefficient associated with at least one of the plurality of gain blocks is twice at least one fine gain coefficient associated with a preceding gain block.

11. The system according to claim 10, wherein the one or more circuits are further configured to partition each of the plurality of gain blocks into a plurality of steps, wherein each step represents a particular fine gain coefficient within the set of the plurality of fine gain coefficients partitioned into the corresponding gain block.

12. The system according to claim 11, wherein one of the plurality of gain blocks comprising the plurality of steps is stored in the lookup table.

13. The system according to claim 8, wherein the interpolating comprises linear interpolation between the current gain value and the fine target gain value.

14. The system according to claim 13, wherein an interpolation rate is adjustable, and
wherein the interpolation rate comprises a number of interpolated fine gain coefficients in the plurality of fine gain coefficients divided by the period of time.

15. A non-transitory machine-readable storage having stored thereon, a computer program having at least one code section for processing an input signal, the at least one code section being executable by a machine for causing the machine to perform steps comprising:
sampling the input signal into a plurality of input signal samples over a period of time;
determining, from a current gain value and a target gain value, a coarse target gain value, a fine target gain value, and a fine current gain value;
interpolating a plurality of fine gain coefficients between the fine current gain value and the fine target gain value using a lookup table;
multiplying, at an interpolation rate, each of the plurality of input signal samples by a corresponding fine gain coefficient from among the plurality of fine gain coefficients, to generate a fine tuned digital output signal; and
bit-shifting the fine tuned digital output signal, using the coarse target gain value, to generate a digital output signal.

16. The non-transitory machine-readable storage according to claim 15, wherein the at least one code section comprises code for partitioning a set of the plurality of fine gain coefficients into a plurality of gain blocks.

17. The non-transitory machine-readable storage according to claim 16, wherein the at least one code section comprises code for setting at least one fine gain coefficient associated with at least one of the plurality of gain blocks at twice at least one fine gain coefficient associated with a preceding gain block.

18. The non-transitory machine-readable storage according to claim 17, wherein the at least one code section comprises code for partitioning each of the plurality of gain blocks into a plurality of steps, wherein each step represents a particular fine gain coefficient within the set of the plurality of fine gain coefficients partitioned into the corresponding gain block.

19. The non-transitory machine-readable storage according to claim 18, wherein the at least one code section comprises code for storing the plurality of steps of one of the plurality of gain blocks in the lookup table.

20. The non-transitory machine-readable storage according to claim 15, wherein the at least one code section comprises code for linear interpolation between the current gain value and the fine target gain value.

21. The non-transitory machine-readable storage according to claim 20, wherein said at least one code section comprises code for adjusting the interpolation rate, and
wherein the interpolation rate comprises a number of interpolated fine gain coefficients in the plurality of fine gain coefficients divided by the period of time.

* * * * *